United States Patent [19]
Dalby

[11] Patent Number: 5,835,353
[45] Date of Patent: Nov. 10, 1998

[54] MODULAR ASSEMBLY FOR SUPPORTING AN ELECTRONIC CIRCUIT PACKAGE

[75] Inventor: Anthony Dalby, Cuffley, England

[73] Assignee: Northern Telecom Limited, Montreal, Canada

[21] Appl. No.: 756,096

[22] Filed: Nov. 22, 1996

[30] Foreign Application Priority Data

Dec. 8, 1995 [GB] United Kingdom .................... 9525093

[51] Int. Cl.⁶ .............................. H05K 7/10; H02G 9/00; H01R 13/62
[52] U.S. Cl. ........................... 361/727; 361/826; 174/38; 439/157; 439/160; 439/164; 439/165; 439/534
[58] Field of Search ........................ 174/37–39; 439/157, 439/160, 164, 165, 534; 361/724–727, 735, 740, 737, 754, 684, 686, 826, 759, 801, 829, 732

[56] References Cited

U.S. PATENT DOCUMENTS 5,253,140  10/1993  Inoue et al. ........................ 439/157 X

*Primary Examiner*—Michael W. Phillips
*Attorney, Agent, or Firm*—John D. Crane

[57] ABSTRACT

A modular electronic assembly comprises an electronic circuit module package having electrical contacts and a carrier having a socket for receiving the package. Lever arms pivotally mounted on the carrier retain the module in the socket in their closed position and eject the module from the socket in their open position. The lever arms also carry electrical contacts for engaging corresponding contacts on the module so as to provide electrical connection thereto. The assembly may be mounted in a housing comprising first and slidably engaging portions such that the size of the housing is adjustable.

8 Claims, 3 Drawing Sheets

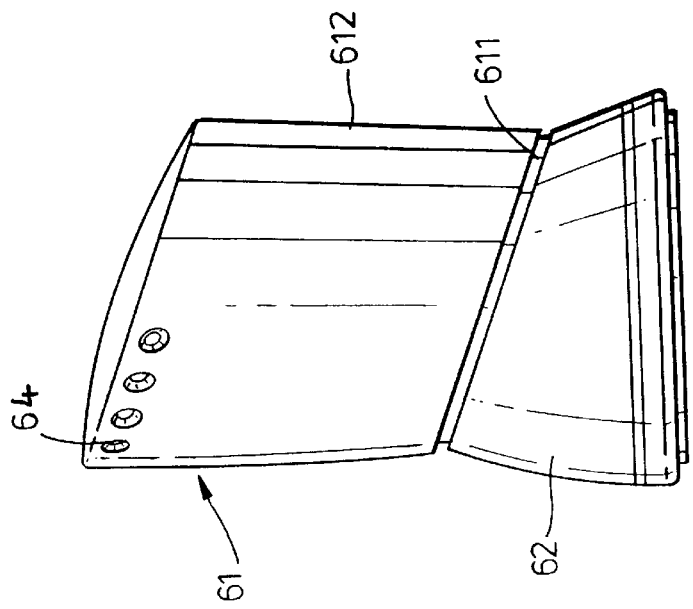
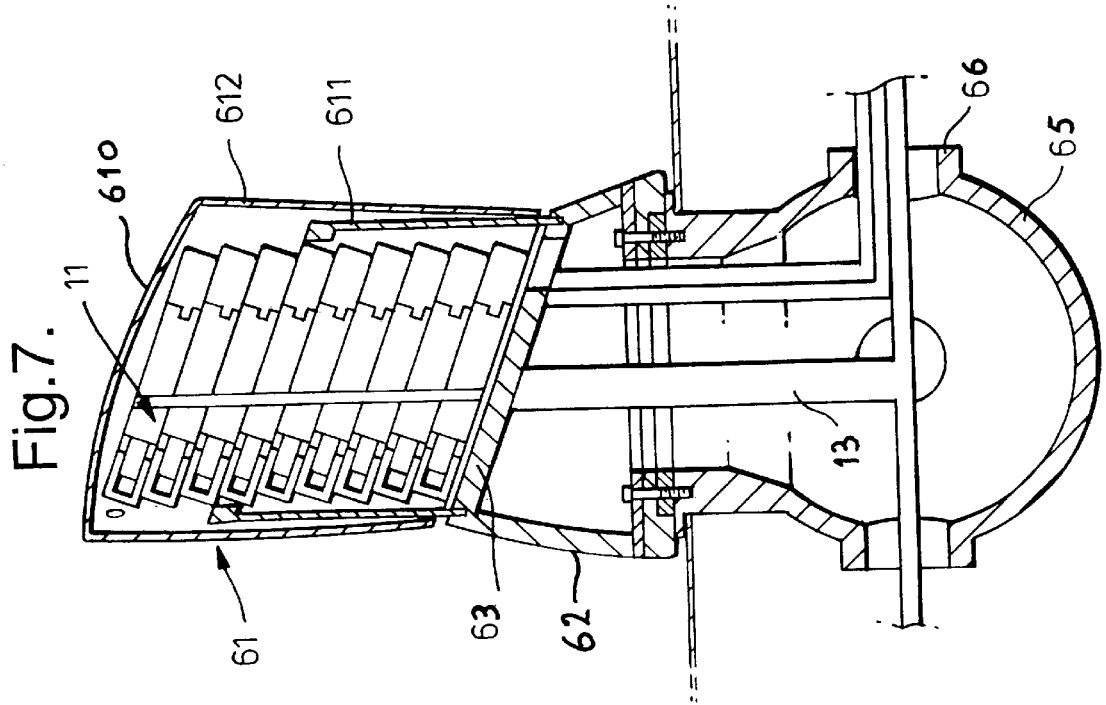

MODULAR ASSEMBLY FOR SUPPORTING AN ELECTRONIC CIRCUIT PACKAGE

BACKGROUND OF THE INVENTION

The rapid increase in cabled broad band systems, commonly referred to as cable television or CATV systems has introduced a need for numerous service point installations or street cabinets to house the electronic equipment required for processing the transmitted signal. A conventional street cabinet contains a number of racks into which circuit boards or cards are inserted. Cable connections are made to the cards via a wiring harness provided in the cabinet.

A particular disadvantage of a conventional street cabinet is its relatively large size and its unsightly appearance. There is thus a reluctance by local planning authorities to grant permission for installation, particularly in conservation areas. A further disadvantage is the difficulty of replacing faulty circuit boards as some skill is required to align a new card with the rack connector into which it is to be inserted so as to minimize the risk of damaging either the card or the connector. This is a particular problem when the cards are closely spaced to provide a high packing density as it is then very difficult to service a card without disturbing its immediate neighbors.

SUMMARY OF THE INVENTION

The object of the invention is to minimise or to overcome these disadvantages.

A further object of the invention is to provide an improved modular equipment assembly.

Another object of the invention is to provide an improved street cabinet construction.

According to one aspect of the invention there is provided a modular electronic assembly, including an electronic circuit module package having electrical contacts, and a carrier having support means for receiving the package and having means for releasably retaining said package, wherein said retaining means comprises one or more arms pivotally mounted on the carrier and having a closed position and an open position, wherein each said arm has electrical contact means for engaging said electrical contacts on the package when that arm is in its closed position, and wherein each said arm has lever means associated therewith for engaging a corresponding slot or socket in the package whereby to retain the package when the arm is in its closed position and to eject the package from the carrier when the arm is in its open position.

According to another aspect of the invention there is provided a street cabinet comprising a housing containing a modular electronic assembly, said electronic assembly including an electronic circuit module or package having electrical contacts, and a carrier having support means for receiving the package and having means for releasably retaining said package, wherein said retaining means comprises one or more arms pivotally mounted on the carrier and having a closed position and an open position, wherein each said arm has electrical contact means for engaging said electrical contacts on the package when that arm is in its closed position, and wherein each said arm has lever means associated therewith for engaging a corresponding slot or socket in the package whereby to retain the package when the arm is in its closed position and to eject the package from the carrier when the arm is in its open position.

In a preferred embodiment the assembly is generally disc shaped and is adapted to be stackable in a cylindrical housing or street cabinet to provide a compact arrangement. Typically, each circuit module or package contains telecommunications equipment.

Replacement of a module in the carrier is a simple operation that can be performed by unskilled staff without the risk of disturbing adjacent modules.

BRIEF DESCRIPTION OF THE DRAWINGS

An embodiment of the invention will now be described with reference to the accompanying drawings in which:

FIG. 7 is a sectional view of a street cabinet containing a stacked arrangement of the modular assemblies of FIG. 1; and FIG. 8 is a general view of the street cabinet of FIG. 7

DESCRIPTION OF PREFERRED EMBODIMENT

Figure 1:
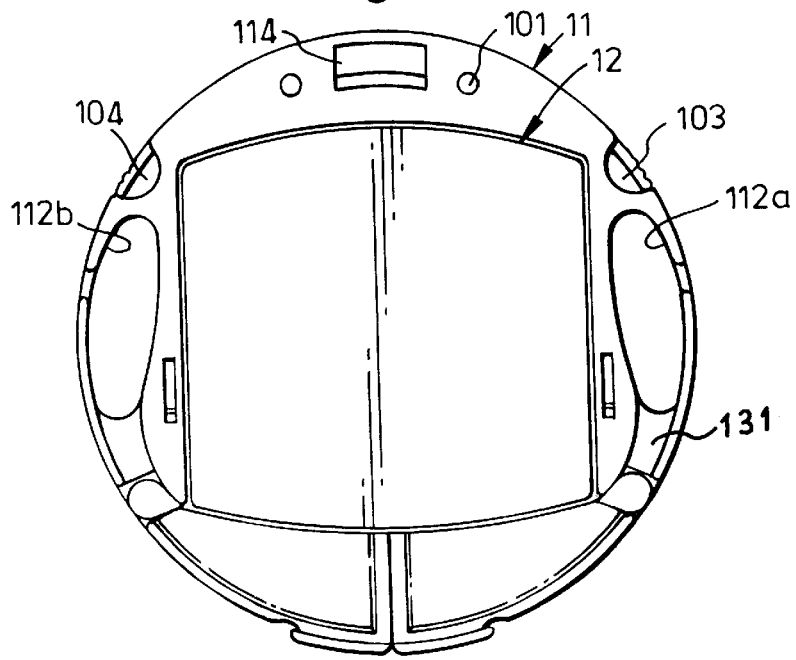
FIG. 1 is a general view of the modular assembly with the electronic module secured in the carrier.
Figure 2:
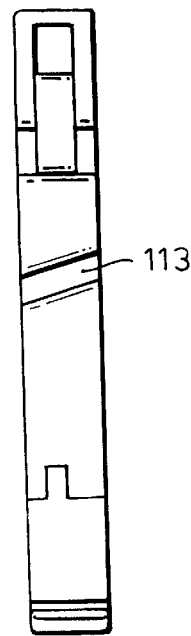
FIG. 2 is a side view of the assembly of FIG. 1.
Figure 3:
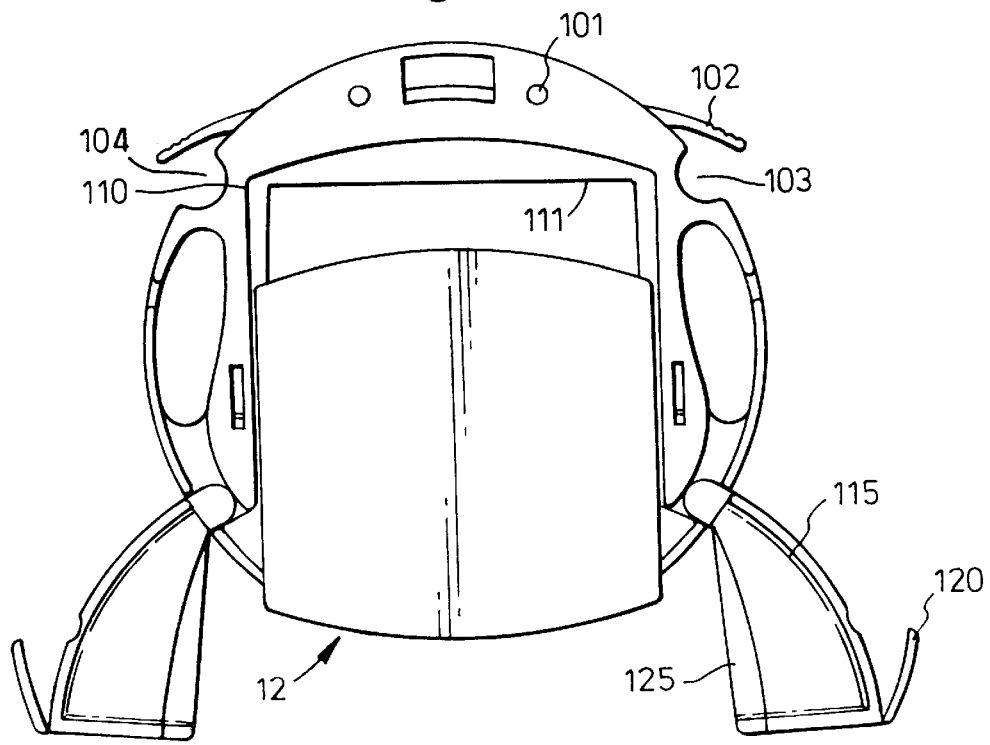
FIG. 3 shows the assembly of FIG. 1 with the module partly ejected from the carrier.

Referring to FIGS. 1 to 4, the modular assembly comprises a carrier 11 having an aperture 110 provided with an inwardly extending flange 111 for receiving and locating an electronic module 12. The carrier has first and second openings 112a, 112b to provide cable ducts for receiving a bundle of cables 13 when the assembly is stacked with a plurality of similar assemblies. Advantageously, the rim of the carrier adjacent the openings is provided with slots 113 communicating with the apertures 112 whereby the assembly may be disengaged from cables disposed in the apertures e.g. to effect removal of the assembly from a stack. Further openings 114 may be formed in the carrier to provide ventilation chimneys in a stacked configuration to facilitate heat dissipation.

In a preferred embodiment, the carrier is provided with extendible pins 101 operable by a cam mechanism (not shown) via levers 102. These pins, which are extended when the levers 102 are in their closed position in abutment with the body of the carrier, are positioned so as to engage corresponding openings (not shown) in the underside of an adjacent carrier in a stacked configuration whereby to secure the two carriers together in the correct relative position. Further openings 103, 104 may be provided between the pins 101 and in the rim of the carrier adjacent the ends of the levers 102 so as to provide ventilation chimneys to facilitate heat dissipation from a stacked configuration.

Figure 4:
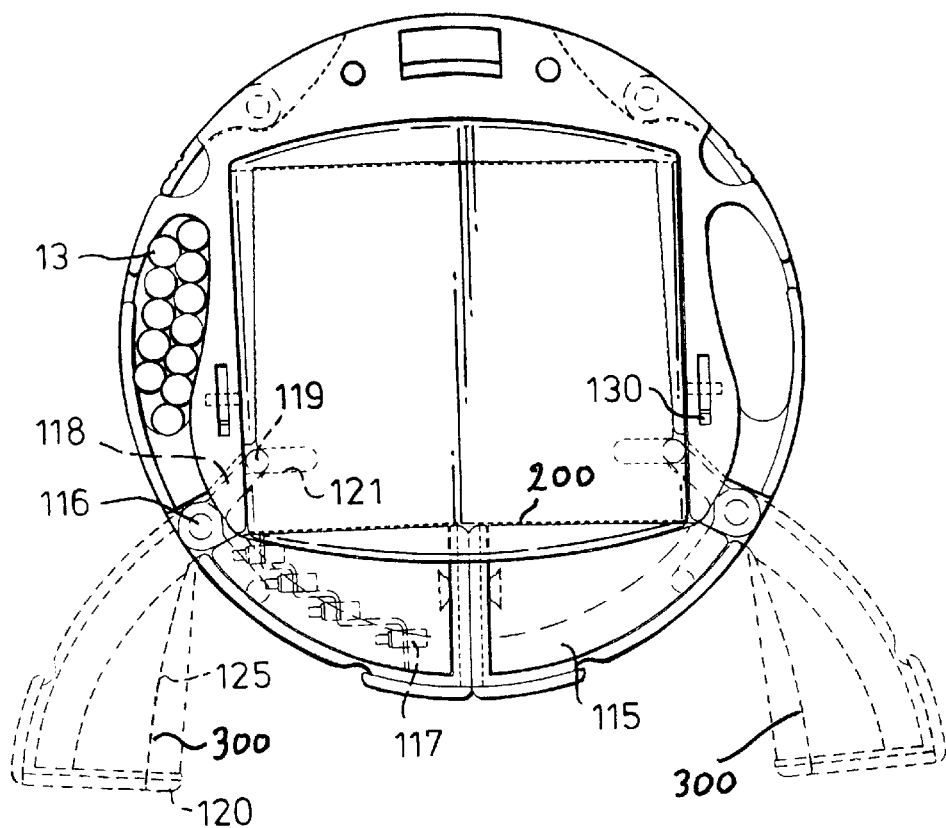
FIG. 4 is a sectional plan view of the assembly of FIG. 1, showing the construction in more detail.

Referring now to FIG. 4, the carrier is provided with a mechanism for locking the module in place and for ejecting the module e.g. to effect replacement. This mechanism comprises first and second arms or levers 115 each pivotally mounted on the carrier via a pin 116 and each having cable termination means 117 for terminating a cable whereby to provide electrical connection via contacts 300 to corresponding contacts 200 on to the module 12. An open channel 131 is formed in the carrier body between each opening 112a, 112b and the respective arm 115 to accommodate a cable branching from the bundle and terminated in the termination means 117. Advantageously the arms 115 are removable from the pins 116 to facilitate coupling of a cable to the terminations 117. Each arm 115 has an inwardly extending lever portion 118 terminating in a spigot 119 engaging a corresponding slot 121 in the module 12. When the arms 115 are in their closed position (shown in solid lines) the module is urged via the lever 118 and spigots 119 to the back of the aperture in the carrier. As the arms 115 are moved towards their open position (shown in dotted lines), the action of the levers 118 urges the module from the aperture, and when the arms 115 are in their fully open position the spigots 119 are completely disengaged from their respective slots 121 allowing removal of the module from the carrier e.g. to effect replacement. When the carrier is mounted in a stacked arrangement, the module may be removed and replaced without removing the carrier from the stack and without disturbing the adjacent carriers and modules in the stack. In some applications latching cams 130 may be provided for securing the carrier to an adjacent carrier in a stack.

Advantageously, latch means 120 are provided at the outer ends of the arms 115 whereby to lock the arms together when in their closed position so as to prevent inadvertent ejection of the module.

Figure 5:
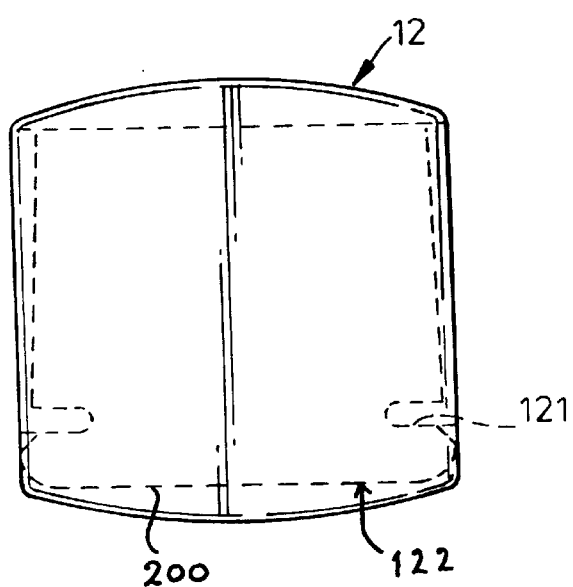
FIG. 5 is a sectional view of the module removed from the assembly.
Figure 6:
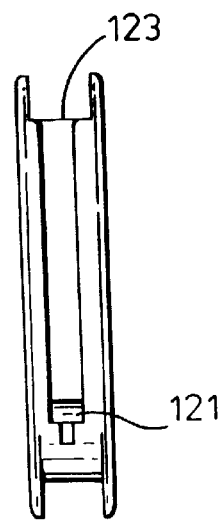
FIG. 6 is a side view of the module.

The module construction is shown in FIGS. 5 and 6. The module comprises a generally rectangular casing having contacts 200 on the surface 122 engaging the arms 115 whereby to effect electrical connection to the circuitry contained in the module. A peripheral groove 123 is provided around the edge of the casing for engaging the flange 111 of the carrier aperture 110 so as to locate the module when inserted in that aperture and to prevent displacement of the module in a direction perpendicular to the plane of the carrier. The peripheral groove may be continued around the front surface 122 of the module and corresponding flanges 125 may be provided on the engagement surfaces of the arms 115 to ensure mutual alignment of the arm and module contacts when the arms are in their closed position in engagement with the module.

FIG. 7 is a sectional view of a street cabinet containing a stacked arrangement of similar module assemblies and FIG. 8 shows a general view of the street cabinet. The cabinet has a generally cylindrical housing 61 and has a base portion 62 incorporating a support floor 63 disposed at an angle to the horizontal. The top surface 610 of the housing is sloped at a similar angle to that of the floor. Preferably the housing 61 comprises an inner or lower housing portion 611 and a removable outer or upper housing portion 612 whereby to provide engineer access to the cabinet. In use, the position of the outer housing portion relative to that of the inner housing portion is adjusted so as to adapt the dimensions of the housing to accommodate a larger or lesser quantity of stacked equipment modules. Ventilation openings 64 are provided on the higher face of the housing adjacent the rim of the upper surface 610. The module assemblies are stacked on the support floor in a parallel off-set arrangement, each carrier being secured to its neighbor in the stack via the extendible pins. We have found that stacking the carriers with their modules in a sloping off-set configuration provides improved heat dissipation. The cabinet may be mounted over an underground chamber 65 in communication with a cable duct 66 whereby to provide cable connection 13 to the individual members of the stack.

It will be understood that although the modular assembly has been described with particular reference to its use in a street cabinet, it is not, of course, limited to that use but is of more general application in the equipment practice field.

I claim:

1. A modular electronic assembly, including an electronic circuit module or package having electrical contacts, and a carrier having support means for receiving the package and having means for releasably retaining said package, wherein said retaining means comprises one or more arms pivotally mounted on the carrier and having a closed position and an open position, wherein each said arm has electrical contacts for engaging said electrical contracts on the package when that arm is in its closed position, and wherein each said arm has a lever associated therewith for engaging a corresponding slot or socket in the package whereby to retain the package when the arm is in its closed position and to eject the package for the carrier when the arm is in its open position.

2. An assembly as claimed in claim 1, wherein said support means comprises an aperture formed in the carrier and having an inwardly extending flange for engaging a corresponding peripheral groove formed in the package.

3. An assembly as claimed in claim 2, wherein each said arm has a flange extending from that portion of the arm arranged to engage the package whereby to co-operate with the peripheral groove when the arm is in its closed position so as to align the arm with the package.

4. An assembly as claimed in claim 3, wherein the assembly is adapted to be mounted in a stacked configuration with a plurality of similar assemblies, and wherein the carrier has one or more openings each providing a cable channel in said stacked configuration.

5. An assembly as claimed in claim 4, wherein the carrier has extendible pins for engaging corresponding sockets in an adjacent carrier in a stacked configuration whereby to secure the carrier to said adjacent carrier.

6. An assembly as claimed in claim 5, wherein the carrier has further openings whereby to provide ventilation channels in said stacked configuration.

7. A street cabinet comprising a housing containing a modular electronic assembly, said electronic assembly including an electronic circuit module or package having electrical contacts, and a carrier having support means for receiving the package and having means for releasably retaining said package, wherein said retaining means comprises one or more arms pivotally mounted on the carrier and having a closed position and an open position, wherein each said arm has electrical contacts for engaging said electrical contacts on the package when that arm is in its closed position, and wherein each said arm has a lever means associated therewith for engaging a corresponding slot or socket in the package whereby to retain the package when the arm is in its closed position and to eject the package from the carrier when the arm is in its open position.

8. A street cabinet as claimed in claim 7, wherein said housing comprises first and second slidably engaging portions such that the size of the housing is adjustable.

* * * * *